United States Patent [19]

Flamm

[11] 4,352,123

[45] Sep. 28, 1982

[54] COLOR-TELEVISION RECEIVER HAVING INTEGRATED CIRCUIT FOR THE LUMINANCE SIGNAL AND THE CHROMINANCE SIGNALS

[75] Inventor: Peter M. Flamm, Freiburg, Fed. Rep. of Germany

[73] Assignee: ITT Industries, Inc., New York, N.Y.

[21] Appl. No.: 237,187

[22] Filed: Feb. 23, 1981

[30] Foreign Application Priority Data

Apr. 19, 1980 [DE] Fed. Rep. of Germany ....... 3015141

[51] Int. Cl.$^3$ .............................................. H04N 9/50
[52] U.S. Cl. .................................... 358/23; 358/21 R
[58] Field of Search ..................... 358/23, 21 R, 13, 30

[56] References Cited

U.S. PATENT DOCUMENTS

| | | | |
|---|---|---|---|
| 3,961,365 | 6/1976 | Payne et al. .......................... | 358/59 |
| 4,194,215 | 3/1980 | Shionoya .............................. | 358/59 |
| 4,270,139 | 5/1981 | Flamm et al. ......................... | 358/23 |

Primary Examiner—Richard Murray
Attorney, Agent, or Firm—John T. O'Halloran; Peter C. Van Der Sluys

[57] ABSTRACT

The invention permits an n bit resolution to be achieved with an n−1 bit converter. In a color television receiver the analog-to-digital converter is a parallel analog-to-digital converter with $p \cdot 2^r - 1$ differential amplifiers as comparators, where r is the number of binary digits of the output signal of the analog-to-digital converter minus one. The composite color signal is then applied as the input signal to the noninverting (or inverting) inputs of all p differential amplifiers and the inverting (noninverting) inputs of the differential amplifiers being connected successively to the taps of a resistive voltage divider which contains equal-value resistors and is fed with a reference voltage (Ur).

For the duration of every second line, either the reference voltage or the input signal is shifted by $U_r \pm 0.5$ $U_r/2^r$.

1 Claim, 3 Drawing Figures

COLOR-TELEVISION RECEIVER HAVING INTEGRATED CIRCUIT FOR THE LUMINANCE SIGNAL AND THE CHROMINANCE SIGNALS

FIELD OF THE INVENTION

Color-television receivers comprising at least one integrated circuit for separating and conditioning the luminance signal and the chrominance signals from the composite color signal are known in the art. The particular color-television receiver of such a known type comprises at least one integrated circuit for separating and conditioning the luminance signal and the chrominance signals from the composite color signal. This integrated circuit contains a chrominance-subcarrier oscillator, a chrominance-subcarrier band-pass filter, a synchronous demodulator, a PAL switch, a color matrix, and, if necessary, an R-G-B matrix. Additionally, such a color-television receiver contains the following subcircuits for conditioning digital signals; (1) the chrominance-subcarrier oscillator is a square-wave clock generator providing four clock signals the first of which has four times the chrominance-subcarrier frequency and the second to fourth of which have the chrominance-subcarrier frequency, with the first and second clock signals having a pulse duty factor of 0.5, and the third and fourth clock signals each consisting of two consecutive, T/2-long pulses separated by T/2 within each 4T-long period (T=period of the first clock signal); (2) an analog-to-digital converter clocked by the first clock signal, whose analog input is presented with the composite color signal, and which forms as its output signal a parallel binary word from the amplitude of the composite color signal (F) at the instants the respective amplitudes of the undemodulated chrominance signal are equal to the amplitudes of the respective color-difference signal; (3) a first binary arithmetic stage which multiplies the output signal of the analog-to-digital converter by a binary overall-contrast control signal; (4) a two stage delay line which delays the output signal of the first binary arithmetic stage by T/2; (5) a second binary arithmetic stage which forms the arithmetic means of the delayed and undelayed output signals of the first binary arithmetic stage; (6) a third binary arithmetic stage, which subtracts the output signal of the second binary arithmetic stage from the output signal of the first delay stage; (7) a buffer-memory arrangement which temporarily stores the output signal of the third binary arithmetic stage, and whose enable input is fed with the third clock signal; (8) a shift-register arrangement consisting of n parallel shift registers (n=number of bits at the output of the third binary arithmetic stage) each of which provides a delay of one line period and whose serial inputs are connected to the parallel outputs of the buffer-memory arrangement, while their clock inputs are fed with the fourth clock signal; (9) a fourth binary arithmetic stage which forms the arithmetic mean of the input and output signals of the shift-register arrangement; (10) a fifth binary arithmetic stage which subtracts the input signal of the shift-register arrangement from the output signal of this arrangement and then divides the difference by two; (11) a sixth binary arithmetic stage which, controlled by the PAL switch, either leaves the output signal of the fifth binary arithmetic stage unchanged or forms its absolute value; (12) a seventh binary arithmetic stage which forms the green color-difference signal from the output signals of the fourth and sixth binary arithmetic stages; (13) the outputs of the second, fourth, sixth and seventh binary arithmetic stages are connected to the binary R-G-B matrix each of whose outputs is coupled to one of three digital-to-analog converters for deriving the analog signals for controlling the R-G-B values of the picture tube, or (14) the outputs of the second, fourth, sixth and seventh binary arithmetic stages are each connected to one of four digital-to-analog converters for deriving the analog signals for controlling the color-difference values of the picture tube. An essential feature of such a receiver is the use of an analog-to-digital converter whose analog input is presented with the composite color signal and which is clocked by a clock signal at four times the chrominance-subcarrier frequency, so that a parallel binary word is obtained from the amplitudes of the composite color signal at the instants the respective amplitudes of the undemodulated chrominance signal are equal to the amplitudes of the respective color-difference signal.

Thus, because of the high frequencies to be be processed, a parallel analog-to-digital converter is needed. Such fast parallel analog-to-digital converters are well known (cf. D. F. Hoeschele, "Analog-to-Digital/Digital-to-Analog Conversion Techniques", New York, 1968, p. 10) and contain $2^s - 1$ differential amplifiers as comparators, where s is the number of binary digits of the digital converter output signal. The noninverting (or inverting) inputs of all differential amplifiers are presented with the composite color signal, while the inverting (or noninverting) inputs are connected successively to the taps of a resistive voltage divider inserted between a constant reference voltage and ground and consisting of $2^s$ or $2^s - 1$ equal-value resistors.

A 6-bit parallel analog-to-digital converter thus has 63 comparators and 63 resistors. A 7-bit converter has 127 comparators and resistors, and an 8-bit converter even has 255 comparators and resistors. It is readily apparent that as the number of digits increases, the implementation of such converters using integrated circuit techniques quickly becomes uneconomical. In particular, a reduction by one digit would result in the component count being halved.

SUMMARY OF THE INVENTION

Accordingly, the object of the invention is to reduce the number of comparators and resistors in an arrangement as set forth hereinbefore to one half without adversely affecting the digital resolution. In other words, the invention is to permit a 6-bit resolution, for example, to be achieved with a 5-bit converter. This is done by using the means set forth above recourse being had to the principle described in the above-cited book on pp. 413 to 415 as follows: In color-television receiver described above, the analog-to-digital converter is a parallel analog-to-digital converter with $p = 2^r - 1$ differential amplifiers as comparators, where r is the number of binary digits of the output signal of the analog-to-digital converter minus one. The composite color signal is then applied as the input signal to the noninverting (or inverting) inputs of all p differential amplifiers and the inverting (noninverting) inputs of the differential amplifiers being connected successively to the taps of a resistive voltage divider which contains equal-value resistors and is fed with a reference voltage (Ur). For the duration of every second line, either the reference voltage or the input signal is shifted by $\Delta U = 0.5\, U_r/2^r$.

BRIEF DESCRIPTION OF THE DRAWINGS

The invention will now be explained in more detail with reference to the accompanying drawings, in which.

DESCRIPTION OF THE BEST MODE

At the outset, FIG. 1, will be explained to permit a better understanding of the invention.

Figure 1:
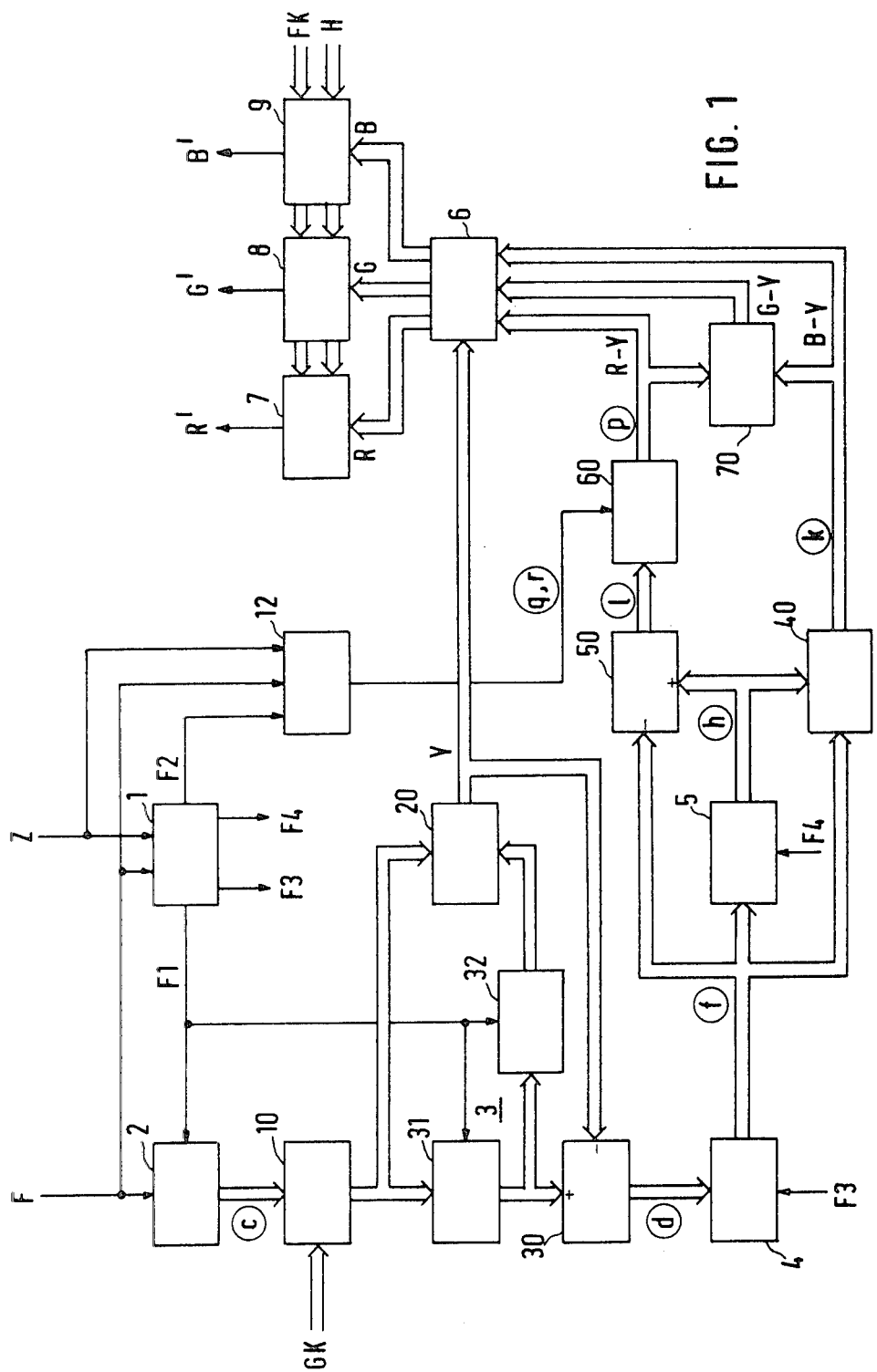
FIG. 1 shows the block diagram of a color-television receiver of a known type.
Figure 2:
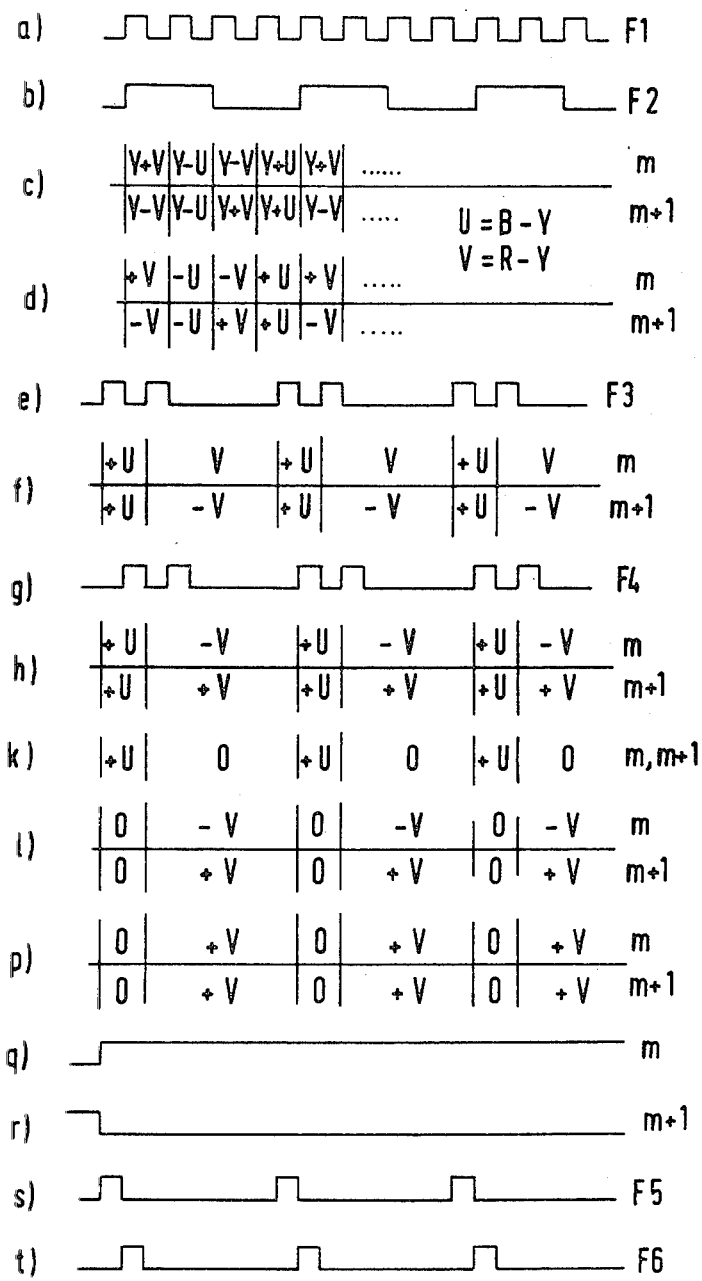
FIGS. 2*a–h, k, l,* and *p–t* show various waveforms occurring in the arrangement of FIG. 1, and, in tabular form, signals occurring at given points of the circuit at given times.
Figure 3:
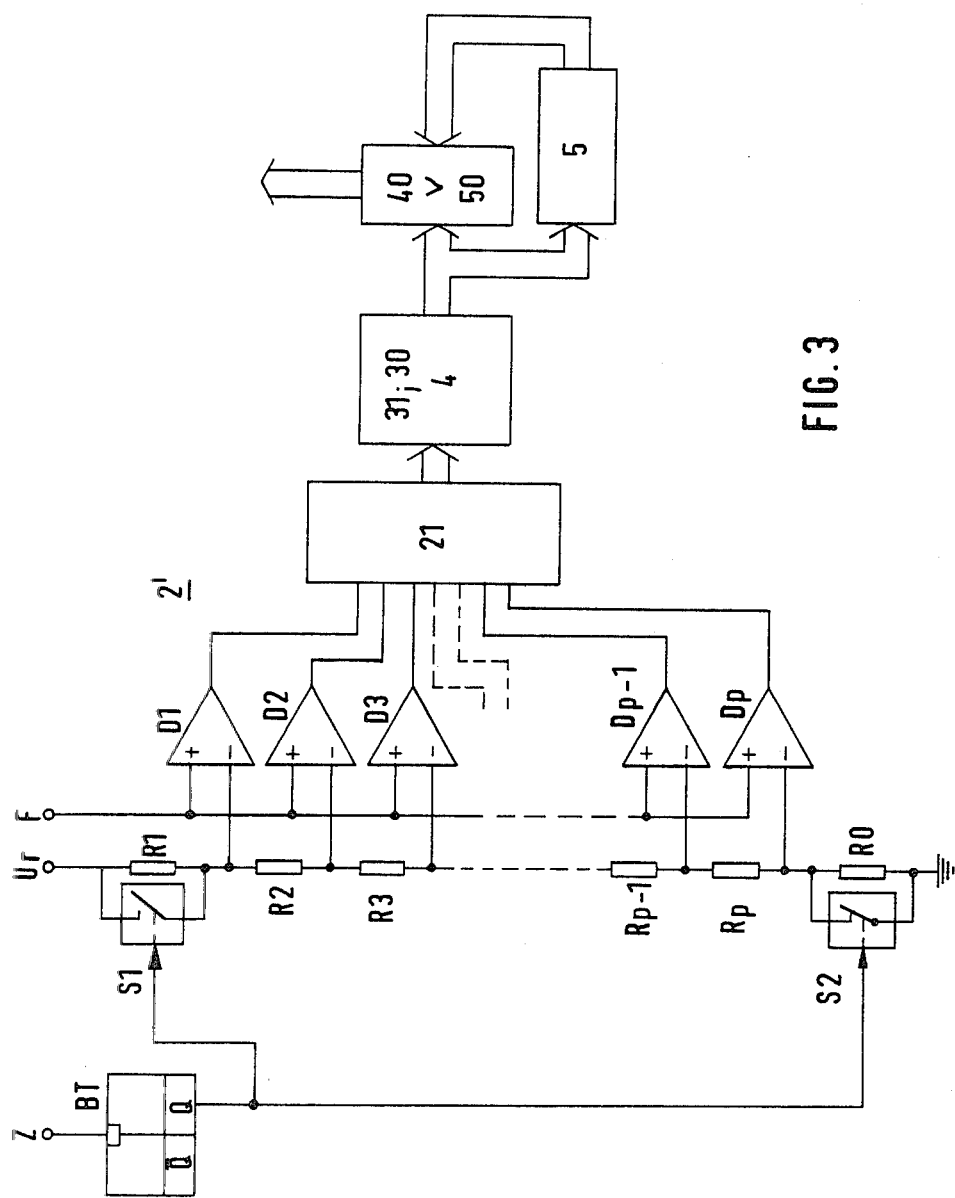
FIG. 3 is a block diagram of a preferred embodiment of the invention.

In the block diagrams shown in FIGS. 1 to 3, like parts are designated by like reference characters. In addition to interconnections indicated by solid lines as is usual in circuit diagrams, these figures contain interconnections indicated by stripes. These stripes mark connections between digital parallel outputs of the delivering portion of the circuit and digital parallel inputs of the receiving portion. The interconnections indicated by stripes, therefore, consist of at least as many wires as there are bits in the binary word to be transferred. Thus, the signals transferred over the lines indicated by stripes in FIGS. 1 to 3 are all binary signals whose instantaneous binary value corresponds to the instantaneous analog value of the composite color signal and of other signals.

Like in conventional color-television receivers, the composite color signal F, derived in the usual manner controls the chrominance-subcarrier oscillator, which, according to the invention, is designed as a squarewave clock generator 1. By means of the so-called burst contained in the composite color signal F, the clock generator 1 is synchronized to the transmitted chrominance-subcarrier frequency. The clock generator 1 generates the clock signal F1, whose frequency is four times the chrominance-subcarrier frequency, i.e. about 17.73 MHz (precisely 17.734475 MHz) in the case of the CCIR standard.

The clock generator 1 also generates the square-wave clock signal F2 having the frequency of the chrominance subcarrier. The first and second clock signals F1, F2 have a pulse duty factor of 0.5 (cf. FIGS. 2*a* and 2*b*). In addition, the clock generator 1 generates the third clock signal F3 and the fourth clock signal F4, each of which consists of two consecutive, T/2-long pulses separated by T/2 within each 4T-long period, where T is the period of the first clock signal F1. The third and fourth clock signals F3, F4 are shown in FIGS. 2*b* and 2*g*.

The individual clock signals are generated within the clock generator 1 in the usual manner using conventional digital techniques. The clock signal F1, for instance, may be generated by means of a suitable 17.73—MHz crystal, and the clock signals F2, F3, F4 may be derived therefrom by frequency division and suitable elimination of pulses. Like in conventional color-television receivers, the clock generator 1 is also fed with a pulse Z from the horizontal output stage during which the clock generator 1 is sychronized by the burst.

The composite color signal F is also applied to the analog input of the analog-to-digital converter 2, which is clocked by the first clock signal F1 and, (at the beginning of each pulse of the first clock signal F1) forms from the amplitude of this pulse a parallel binary word and delivers it as an output signal. These leading edges of the pulses of the first clock signal F1 thus occur at the instants the respective amplitudes of the undemodulated chrominance signal contained in the composite color signal are equal to the amplitudes of the respective color-difference signal.

These parallel binary words then remain unchanged for the respective period T of the first clock signal F1, i.e., they are held like in a sample-and-hold circuit. The signals appearing at the output of the analog-to-digital converter 2 are given in tabular form in FIG. 2*c*, where the vertical lines symbolize the respective clock periods of the first clock signal F1. The letter c of FIG. 2 is also shown in FIG. 1 (encircled).

According to FIG. 2*c*, successive signals Y+V, Y−U, Y−V, and Y+U are obtained in a line m during one period of the second clock signal F2, where U, V and Y have the formal meanings given in the above-mentioned book, namely U=B−Y, V=R−Y, B=blue chrominance signal, R=red chrominance signal, and Y=luminance signal, but designate here the corresponding digitized signals, i.e., the corresponding binary words. The second line in the Table of FIG. 2*c* gives the corresponding binary signals in the line m+1, namely the signals Y−V, Y−U and Y+U, occurring during that period of the clock signal F2 which is under consideration.

This output signal of the analog-to-digital converter 2 is applied to one of the two inputs of the first binary arithmetic stage 10, which multiplies this output signal by a binary overall-contrast control signal GK. This overall contrast control signal thus corresponds to the analog overall-contrast control signal present in conventional color-television receivers. In present day color-television receivers, the binary overall contrast control signal GK, just as the binary color-saturation control signal FK and the binary brightness control signal H to be explained below, is available in digital form, because remote-control units and digital controls are usually present which provide these signals.

An advantage of the present application is, therefore, seen in the fact that these signals need no longer be conditioned in analog form in their place of action.

The output signal of the first binary arithmetic stage 10 is fed to the second binary arithmetic stage 20 and to the two-stage delay line 3, which delays this output signal by T/2. The second binary arithmetic stage 20 forms the arithmetic mean of the delayed and undelayed signals. The underlying idea is that if a sinusoidal signal, namely the chrominance subcarrier, is sampled at double frequency, the mean of two successive sample values will always be zero. Thus, by forming the arithmetic means in the second binary arithmetic stage 20, the chrominance subcarrier is suppressed and the luminance signal Y is obtained in digital form.

The output signal of the first binary arithmetic stage 10, delayed in the first stage 31 of the delay line 3 by half the delay provided by this stage, i.e., by T/4, and the output signal of the second binary arithmetic stage 20 are then fed to the third binary arithmetic stage 30, which subtracts the latter signal, i.e., the Y signal, from the former signal. As a result, the output of the third binary arithmetic stage 30 provides the color-difference signal, made up of the successive components B−Y, R−Y, −(B−Y) and −(R−Y), as shown in FIG. 2*d* in tabular form for the lines m and m+1.

These signals are fed to the buffer-memory arrangement 4, whose enable input is fed with the third clock signal F3, which is shown in FIG. 2e. This buffer memory operates in such a manner that the binary word fed to the input at the beginning of each pulse of the third clock signal F3 appears at the output when the next clock pulse occurs. Thus, the instantaneous output signals given in FIG. 2f in tabular form for the lines m and m+1 are obtained. The individual stages of the buffer-memory arrangement may be so-called D flip-flops, for example.

The output signal of the buffer-memory arrangement 4 is applied to the shift-register arrangement 5, which consists of n parallel shift registers, where n is the number of bits at the ouput of the third binary arithmetic stage 30. The delay provided by the n parallel shift registers is equal to the duration of one line, i.e., 64 $\mu$s in the case of PAL television sets. The clock inputs of the n parallel shift registers are fed with the fourth clock signal F4, which is shown in FIG. 2g. The output signal of the shift-register arrangement is given in tabular form in FIG. 2h for the lines m and m+1.

This output signal, together with the input signal of the shift-register arrangement 5 is fed to the fourth binary arithmetic stage 40, which forms the arithmetic means of the two signals, so that its output provides the signal B−Y in digital form, which is given in tabular form in FIG. 2k. The input and output signals of the shift-register arrangement 5 are also fed to the fifth binary arithmetic stage 50, which subtracts the input signal from the output signal and divides the difference by two. By the division, a sort of averaging is performed as well.

The output signal of the fifth binary arithmetic stage 50 is given in tabular form in FIG. 21, again for the lines m and m+1. This output signal is fed to the sixth binary arithmetic stage 60, which, in response to the output signal of the PAL switch 12, leaves it unchanged in one line and forms its absolute value in the other. "To form the absolute value" is used here first of all in the mathematical sense i.e., the negative sign of a negative number is suppressed and only the positive value of this negative number is taken into account. Within the scope of the present invention, however, "absolute value" also means "value with respect to a constant number". By this it is meant that for a number A below the constant X, the "absolute value with respect to X" is 2X−A. Thus, for the number 30, the "absolute value with respect to 50" is 70. The output of the sixth binary arithmetic stage 60 thus provides the PAL compensated signal R−Y in digital form, i.e., the red color-difference signal, which is given in tabular form in FIG. 2p for the lines m and m+1.

The output signals of the fourth binary arithmetic stage 40 and of the sixth binary arithmetic stage 60 are fed to the seventh binary arithmetic stage 70, which forms the green color-difference signal G−Y by the well-known formula Y=0.3R+0.59G+0.11B.

The subcircuits 5, 40, 50, 60 and 70, together with the PAL switch 12, represent the portion for correcting the phase of the received signal by the PAL method.

The output signals of the second, fourth, sixth and seventh binary arithmetic stages 20, 40, 60, 70, i.e., the luminance signal Y and the color-difference signals B−Y, R−Y, and G−Y, are then fed to the binary R-G-B matrix 6, which forms therefrom the binary chrominance signals R, G, B by the above formula. Each of these binary chrominance signals is then fed to one of the three digital-to-analog converters 7, 8, 9, which convert the binary chrominance signals to the analog chrominance signals R', G', B' necessary for R-G-B control of the picture tube.

In the embodiment of FIG. 1, each of thes digital-to-analog converters is also fed with the color-saturation control signal FK and the brightness control signal H, both in binary form. The PAL switch 12 is fed with the second clock signal F2, i.e., a signal having the chrominance-subcarrier frequency locked to the burst, with the composite color signal F, and with the reference pulse Z from the horizontal output stage.

FIG. 3 shows the block diagram of an embodiment of the invention. The analog-to-digital converter 2 is designed as a parallel analog-to-digital converter 2' and contains the differential amplifiers D1, D2, D3, Dp−1, Dp which are used as comparators, the resistors R1, R2, R3, Rp−1, Rp, RO, connected in series to form a voltage divider, and the decoder 21, which changes the output signals of the comparators into corresponding binary words. That portion of FIG. 3 located on the right-hand side of the decoder 21 is a greatly simplified representation of the units designated by like reference characters in FIG. 1.

The parallel analog-to-digital converter 2' contains p=$2^r$−1 differential amplifiers and a corresponding number of resistors, where r is the number of binary digits of the output signal of the analog-to-digital converter 2 of FIG. 1 minus one. If the analog-to-digital converter is to provide 8 bits, for example, then r is 7. The resistors R2 to Rp are alike and have a value of R, while the resistors RO, R1 have a value of 0.5 R.

According to the invention, the reference voltage applied to the comparators, in the embodiment of FIG. 3 to all inverting inputs, is shifted by $\Delta U = 0.5\ Ur/2^r$ during every second line as electronic switches S1 and S2 in parallel with resistors R1 and RO, respectively, are opened and closed alternately. Their control signal comes from one of the outputs Q, Q of the binary divider BT, which is fed with the horizontal synchronizing or horizontal flyback pulses Z.

Instead of shifting the reference voltage Ur as described, the amount of change $\Delta U$ may be added to the composite color signal in an analog adding stage during every second line. The reference voltage UR then remains constant.

By influencing the reference voltage Ur during every second line, and with the fourth or fifth binary arithmetic stage 40, 50 and the shift-register arrangement 5, which acts as a delay stage providing a delay of exactly one line period, the intended effect is produced, i.e., the number of comparators required is reduced to one half, while the resolution corresponds to that achieved with an additional binary digit since the average of the signals of two successive lines is taken at the output of the fourth or fifth binary arithmetic stage 40,50.

The principle explained with the aid of FIG. 3 can also be applied to the luminance channel if a comb filter and a delay arrangement providing a delay of one line period are provided in this channel.

I claim:

1. A color-television receiver comprising at least one integrated circuit for separating and conditioning the luminance signal and the chrominance signals from the composite color signal, said integrated circuit containing:

a chrominance-subcarrier oscillator,
    a chrominance-subcarrier band-pass filter, a synchronous demodulator,
a PAL switch,
a color matrix, and, if necessary,
an R—G—B matrix, and being characterized by the following subcircuits for conditioning digital signals:

the chrominance-subcarrier oscillator is a square-wave clock generator providing four clock signals the first of which has four times the chrominance-subcarrier frequency and the second to fourth of which have the chrominance-subcarrier frequency, with the first and second clock signals having a pulse duty factor of 0.5, and the third and fourth clock signals each consisting of two consecutive, T/2-long pulses separated by T/2 within each 4T-long period (T=period of the first clock signal);

an analog-to-digital converter clocked by the first clock signal, whose analog input is presented with the composite color signal, and which forms as its output signal a parallel binary word from the amplitude of the composite color signal (F) at the instants the respective amplitudes of the undemodulated chrominance signal are equal to the amplitudes of the respective color-difference signal;

a first binary arithmetic stage which multiplies the output signal of the analog-to-digital converter by a binary overall-contrast control signal;

a two-stage delay line which delays the output signal of the first binary arithmetic stage by T/2;

a second binary arithmetic stage which forms the arithmetic mean of the delayed and undelayed output signals of the first binary arithmetic stage;

a third binary arithmetic stage which subtracts the output signal of the second binary arithmetic stage from the output signal of the first delay stage;

a buffer-memory arrangement which temporarily stores the output signal of the third binary arithmetic stage, and whose enable input is fed with the third clock signal;

a shift-register arrangement consisting of n parallel shift registers (n=number of bits at the output of the third binary arithmetic stage) each of which provides a delay of one line period and whose serial inputs are connected to the parallel outputs of the buffer-memory arrangement, while their clock inputs are fed with the fourth clock signal;

a fourth binary arithmetic stage which forms the arithmetic mean of the input and output signals of the shift-register arrangement;

a fifth binary arithmetic stage which subtracts the input signal of the shift-register arrangement from the output signal of this arrangement and then divides the difference by two;

a sixth binary arithmetic stage which, controlled by the PAL switch, either leaves the output signal of the fifth binary arithmetic stage unchanged or forms its absolute value;

a seventh binary arithmetic stage which forms the green color-difference signal from the output signals of the fourth and sixth binary arithmetic stages;

the outputs of the second, fourth, sixth and seventh binary arithmetic stages are connected to the binary R-G-B matrix each of whose outputs is coupled to one of three digital-to-analog converters for deriving the analog signals for controlling the R-G-B values of the picture tube, or the outputs of the second, fourth, sixth and seventh binary arithmetic stages are each connected to one of four digital-to-analog converters for deriving the analog signals for controlling the color-difference value of the picture tube;

the improvement wherein the analog-to-digital converter is a parallel analog-to-digital converter with $p=2^r-1$ differential amplifiers as comparators, where r is the number of binary digits of the output signal of the analog-to-digital converter minus one, the composite color signal being applied as the input signal to one of the non-inverting or inverting inputs of all p differential amplifiers and the other of the inverting or noninverting inputs of the differential amplifiers being connected successively to the taps of a resistive voltage divider which contains equal-value resistors and is fed with a reference voltage (Ur), and for the duration of every second line, either the reference voltage (Ur) or the input signal (F) is shifted by $\Delta U = 0.5\ U_r/2^r$.

* * * * *